(12) United States Patent
Yamazaki

(10) Patent No.: US 6,442,028 B2
(45) Date of Patent: Aug. 27, 2002

(54) ELECTRONIC DEVICE

(75) Inventor: Kouichi Yamazaki, Miyagi (JP)

(73) Assignee: Sony Computer Entertainment, Inc., Tokyo (JP)

(*) Notice: Subject to any disclaimer, the term of this patent is extended or adjusted under 35 U.S.C. 154(b) by 0 days.

(21) Appl. No.: 09/848,679

(22) Filed: May 3, 2001

(30) Foreign Application Priority Data

May 9, 2000 (JP) ........................................ 2000-135785

(51) Int. Cl.[7] ................................................ H05K 7/20
(52) U.S. Cl. ..................... 361/704; 174/35 R; 361/719; 361/818
(58) Field of Search ............................... 165/80.3, 185; 174/16.3, 35 R, 252; 361/687, 704, 705, 707, 709–712, 715, 717–719, 816, 818

(56) References Cited

U.S. PATENT DOCUMENTS

| 4,668,898 A | * | 5/1987 | Harms et al. | 318/254 |
| 5,566,052 A | * | 10/1996 | Hughes | 361/704 |
| 5,966,648 A | * | 10/1999 | Ortberg et al. | 455/347 |
| 5,999,406 A | * | 12/1999 | McKain et al. | 361/704 |
| 6,049,469 A | * | 4/2000 | Hood, III et al. | 361/818 |
| 6,198,630 B1 | * | 3/2001 | Cromwell | 361/704 |
| 6,239,973 B1 | * | 5/2001 | Taylor et al. | 361/704 |

FOREIGN PATENT DOCUMENTS

| TW | 328859 | 3/1998 |
| TW | 376182 | 12/1999 |

* cited by examiner

Primary Examiner—Gerald Tolin
(74) Attorney, Agent, or Firm—Katten Muchin Zavis Roseman

(57) ABSTRACT

An electronic device having a circuit board, a shielding plate disposed thereon and a three-terminal regulator is provided with a heat sink positioned on the outer side of the circuit board and connected to the three-terminal regulator. The heat of three-terminal regulator is radiated from the heat sink, thus making it possible to prevent heating of the shielding plate. In this way, electronic device elements that do not stand up very well to heat, such as an optical pickup unit, can be placed directly on shielding plate, so that the heat of three-terminal regulator is efficiently dissipated and the size of the electronic devices may be reduced.

9 Claims, 9 Drawing Sheets

ELECTRONIC DEVICE

FIELD OF THE INVENTION

This invention concerns an electronic device that has a circuit board on which is mounted a computation processing device and on which is formed a power supply wiring pattern for supplying electric power to this computation processing device in general, and more particularly, to an electronic device having an efficient heat radiator so that the electronic device can be made more compact.

BACKGROUND OF THE INVENTION

Heretofore, entertainment devices, personal computers, and other electronic devices that employ an optical disk, such as game machines and CD, and DVD players and the like, have been constructed with a disk device that includes an optical pickup unit, a circuit board on which a CPU and image processing unit are mounted, and a cabinet made up of an upper case and lower case that houses such components. And if for example it is an entertainment device, image information and sound information recorded on an optical disk can be played by detecting it with the optical pickup unit, computation-processing it with the CPU and image processing unit, and outputting video and audio control signals to a display device, etc.

With such an electronic device, the playback of image information and sound information is greatly affected by the processing capacity of the CPU and image processing unit, so it is required that the processing capacity of the CPU and image processing unit be accelerated. When the processing capacity of the CPU and image processing unit is accelerated, the electromagnetic waves emitted from their circuit elements become stronger, and normally measures against EMI are implemented.

Specifically, if the cabinet is made of ABS resin, etc., anti-EMI measures are done by covering the circuit board that includes the CPU and image processing unit with metal shielding plates and ensuring electrical continuity between these shielding plates and the grounding pattern formed on the circuit board, which means that the circuit board is housed inside the cabinet sandwiched in between two metal shielding plates. Usually provided on the circuit board is a regulator on the power supply wiring pattern on the circuit board for stabilizing and supplying electric power to the CPU, etc. This regulator converts the difference in input and output voltages to heat and gives off heat, so a mechanism is required to allow the heat of the regulator to escape. In a circuit board covered by two shielding plates as described above, heretofore structures have been adopted in which the shielding plates are brought into contact with the regulator and the heat of the regulator is radiated away.

But as electronic devices have been made smaller, structures have come to be adopted in which a disk device including an optical pickup unit is placed directly over a shielding plate, and in order not to heat up the optical pickup unit with such a structure, this has led to the desire for a structure in which the heat of the regulator is efficiently shed without heating up the shielding plates.

OBJECTS OF THE INVENTION

It is an object of the present invention, therefore, to provide an electronic device that can efficiently radiate the heat of the regulator and promote a smaller overall size construction.

Still other objects and advantages of the invention will become clear upon review of the following detailed description in conjunction with the appended drawings.

SUMMARY OF THE INVENTION

An electronic device comprises a circuit board, on which is mounted a computation processing device on which is formed a power supply wiring pattern for supplying electric power to this computation processing device, covered by metal shielding plates, a regulator to stabilize the supplied voltage mounted on the power supply wiring pattern, and a radiator provided on the regulator positioned on the outer side of said circuit board as seen from the direction normal to the board plane of said circuit board. The heat of the regulator is emitted from a radiator positioned on the outer side of the circuit board, which enables elements that do not stand up very well to heat, such as an optical pickup unit, to be placed directly on the shielding plate.

It is thus desirable that an opening be formed in said shielding plate through which the regulator protrudes without coming into contact with said shielding plate, so that the regulator and shielding plate do not touch one another and the transmission of the heat of the regulator to the shielding plate can be securely prevented.

DETAILED DESCRIPTION OF THE PREFERRED EMBODIMENTS

Figure 1:
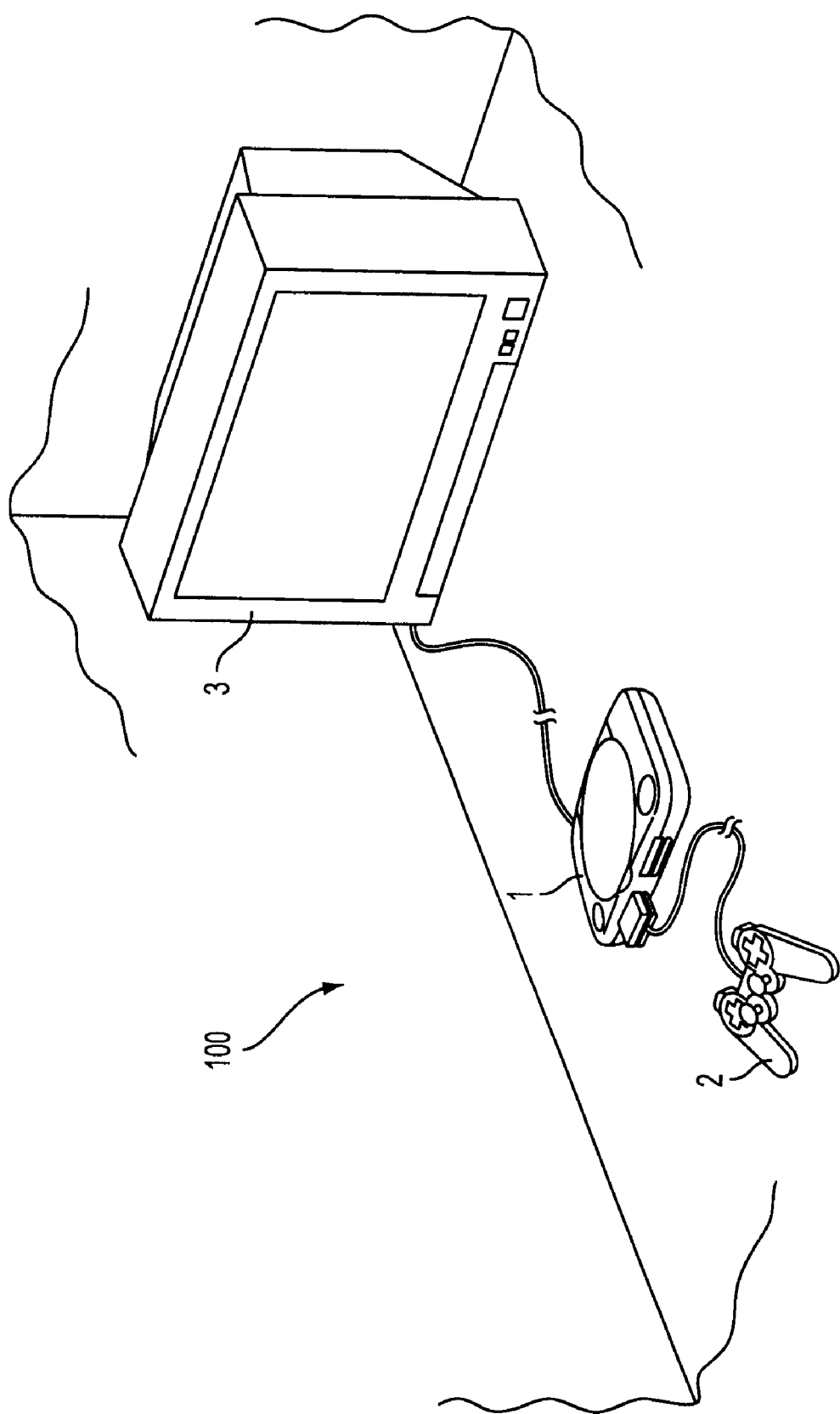
FIG. 1 is a perspective view showing the use of an electronic device of the present invention.

The following detailed description is of the best mode or modes of the invention presently contemplated. Such description is not intended to be understood in a limiting sense, but to be an example of the invention presented solely for illustration thereof, and by reference to which in connection with the following description and the accompanying drawings one skilled in the art may be advised of the advantages and construction of the invention. In the various views of the drawings, like reference characters designate like or similar parts.

Figure 2:
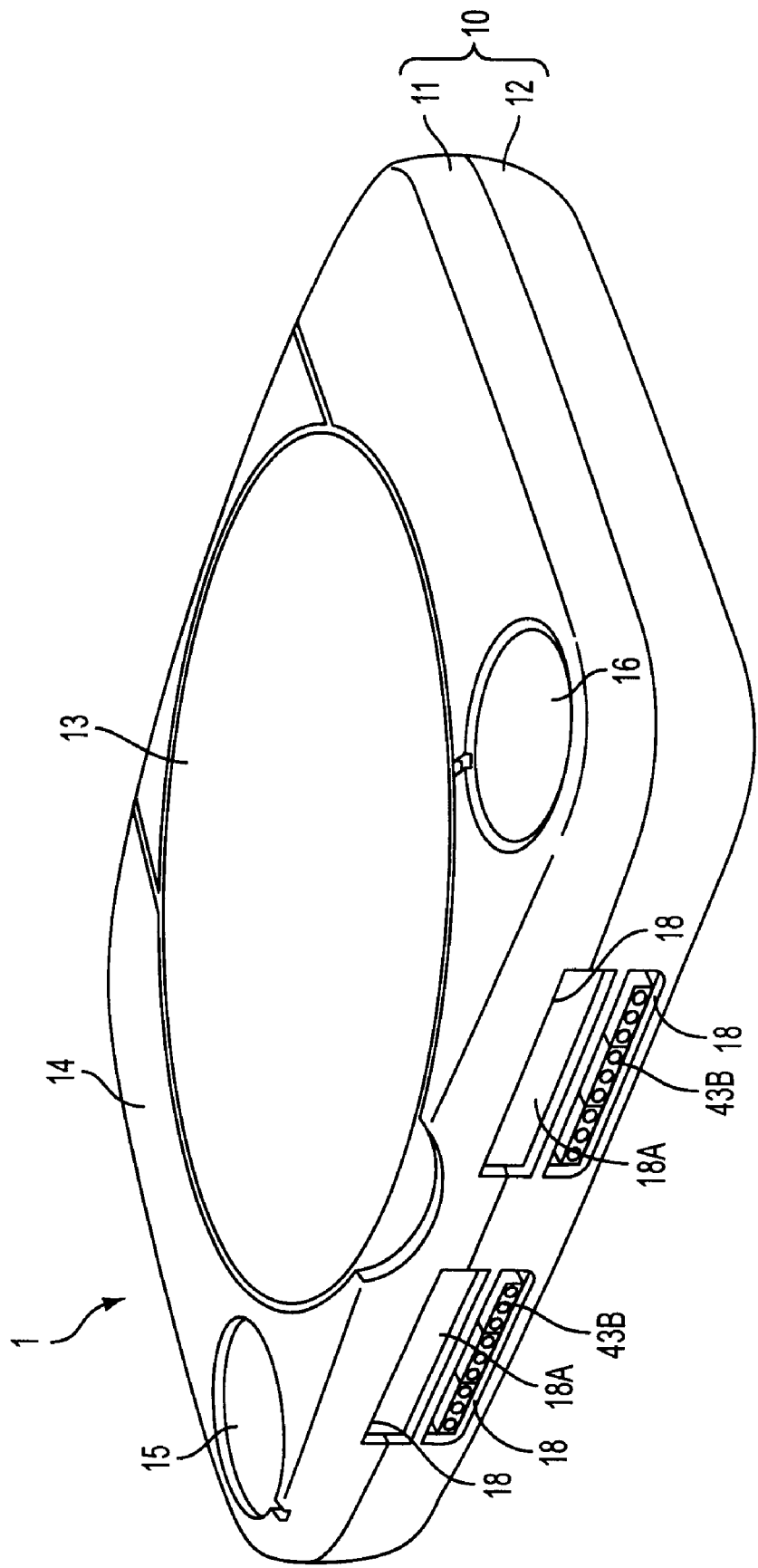
FIG. 2 is a perspective view showing an electronic device of the invention as an entertainment device.

FIG. 1 shows part of a living room 100 in which is set up a television receiver 3, which outputs images and sound, etc., an entertainment device 1, which is an electronic device that is connected to this television receiver 3, and a controller 2, which is an operation device that sends instructions to entertainment device 1. Entertainment device 1 for example reads a game program, etc. recorded on an optical disk, etc. and executes it according to instructions from controller 2 operated by the user As shown in FIG. 2, entertainment device 1 comprises a device main body (not pictured), which has electronic parts, etc., and entertainment device cabinet (hereafter called "cabinet") 10, which is preferably made of ABS resin and has an upper case 11 and a lower case 12 and accommodate the device main body and is preferably formed in a flat square shape. Upper case 11 further comprises a flat roughly circular cover 13 provided in the middle and an upper case main body 14 provided around this cover 13. On the left side of cover 13 is power button 15, which is operated when turning the power to the device on or off, and on the right side of cover 13 is open/close button 16, into which is built an engaging member, not pictured, that advances and retracts with respect to cover 13 for opening and closing said cover 13. One end of cover 13 is rotatably attached to upper case main body 14 (FIG. 3) such that between cover 13 and upper case main body 14 is a coil spring 17, which is wound around the rotation shaft of cover 13, and cover 13 opens and closes using the impelling force of this coil spring 17. Specifically, in the state shown in FIG. 2, when button 16 is pressed, cover 13 opens due to the impelling force of coil spring 17, and chucking member 62 (described below) is exposed. After cover 13 is opened, optical disk 4 is mounted onto chucking member 62, and when cover 13 is closed and power button 15 is pressed, electric power is turned on to the device main body and the content recorded on optical disk 4 can be played back.

Figure 3:
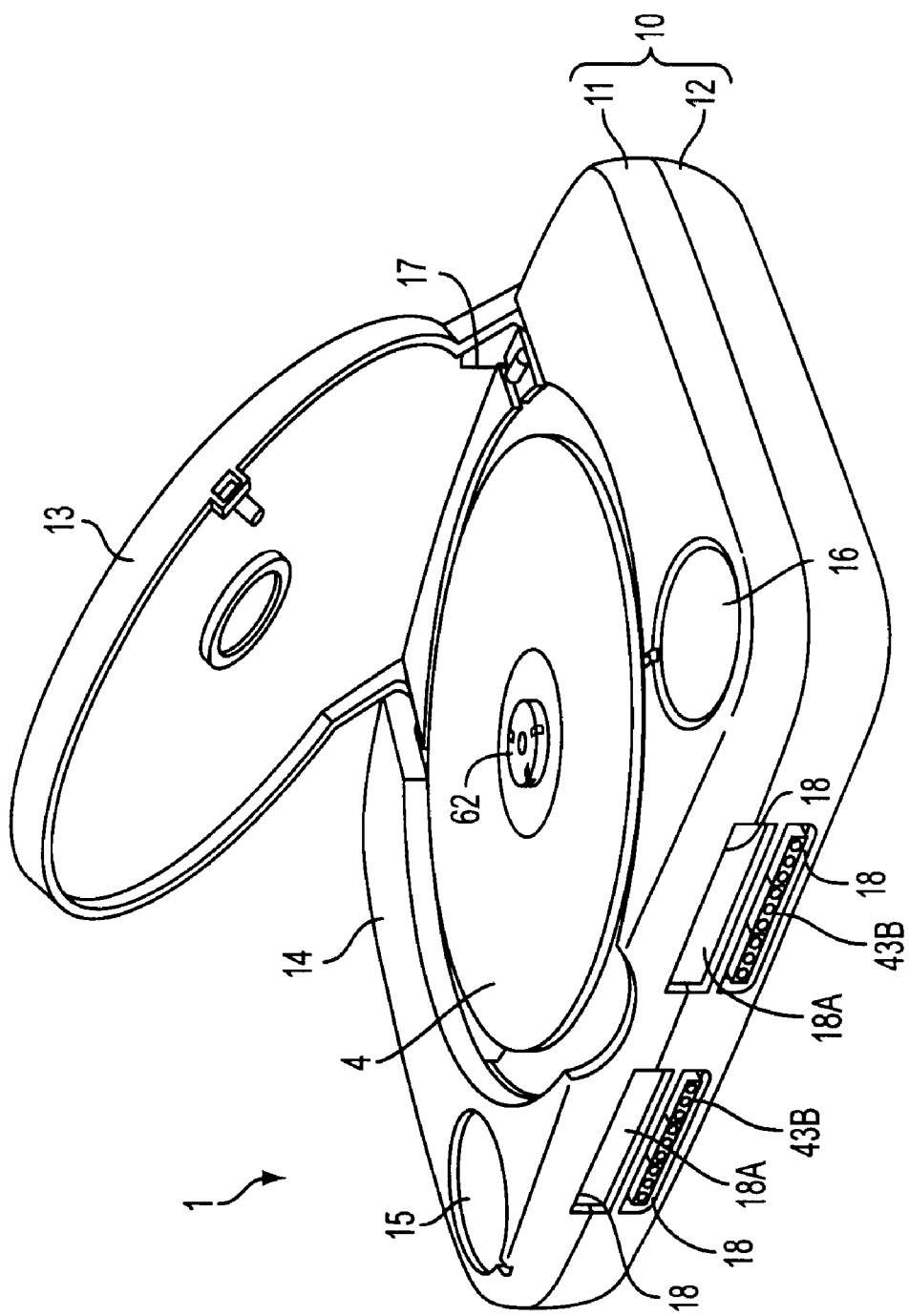
FIG. 3 is a perspective view showing the cover of the entertainment device of FIG. 2 in the open position.
Figure 4:
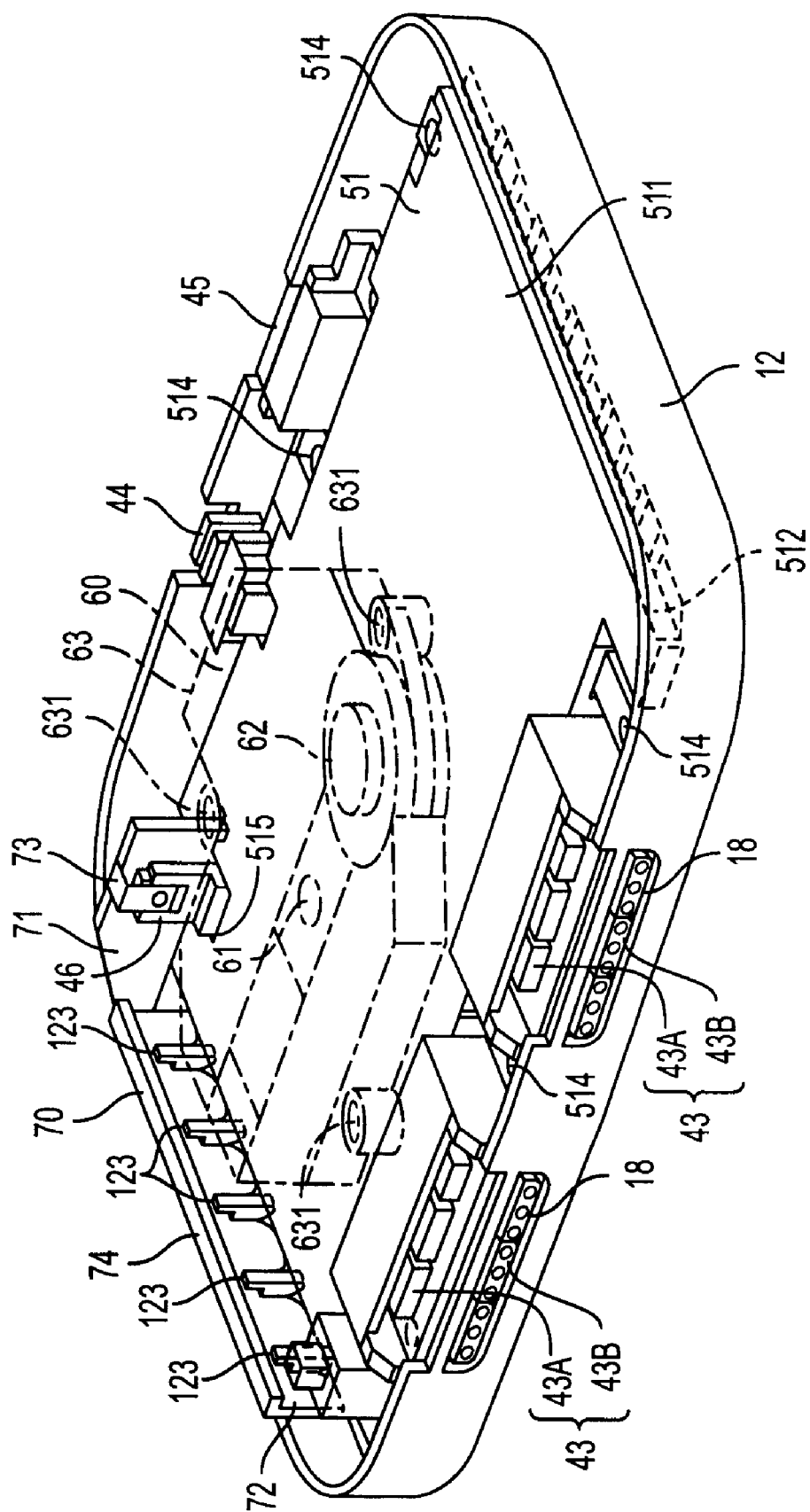
FIG. 4 is a perspective view showing the internal structure of the entertainment device of the present invention.

In addition, four openings 18 are formed on the front surface of cabinet 10 as shown in FIGS. 2–4; with memory card connection parts 43A to be mounted on circuit board 40 (described below) being positioned on the two upper level openings and controller connection parts 43B likewise to be mounted on circuit board 40 being positioned on the two lower level openings 18. Moreover, openings 18 where memory card connection parts 43A are positioned are blocked by shutters 18A, and when the end of a memory card is pushed in, this shutter 18A opens, allowing said memory card to be connected to memory card connection part 43A.

Meanwhile, although not shown in FIGS. 1–3, on the surface of the side of cabinet 10 opposite the side on which openings 18 are formed, are formed an opening that exposes power connector 44 (see FIG. 4) for supplying electric power from an external power source (not shown) to the device main body, and an opening that exposes audiovisual output terminal 45 (see FIG. 4) for outputting to television receiver 3 the audio, video, and other signals recorded on the optical disk.

Figure 5:
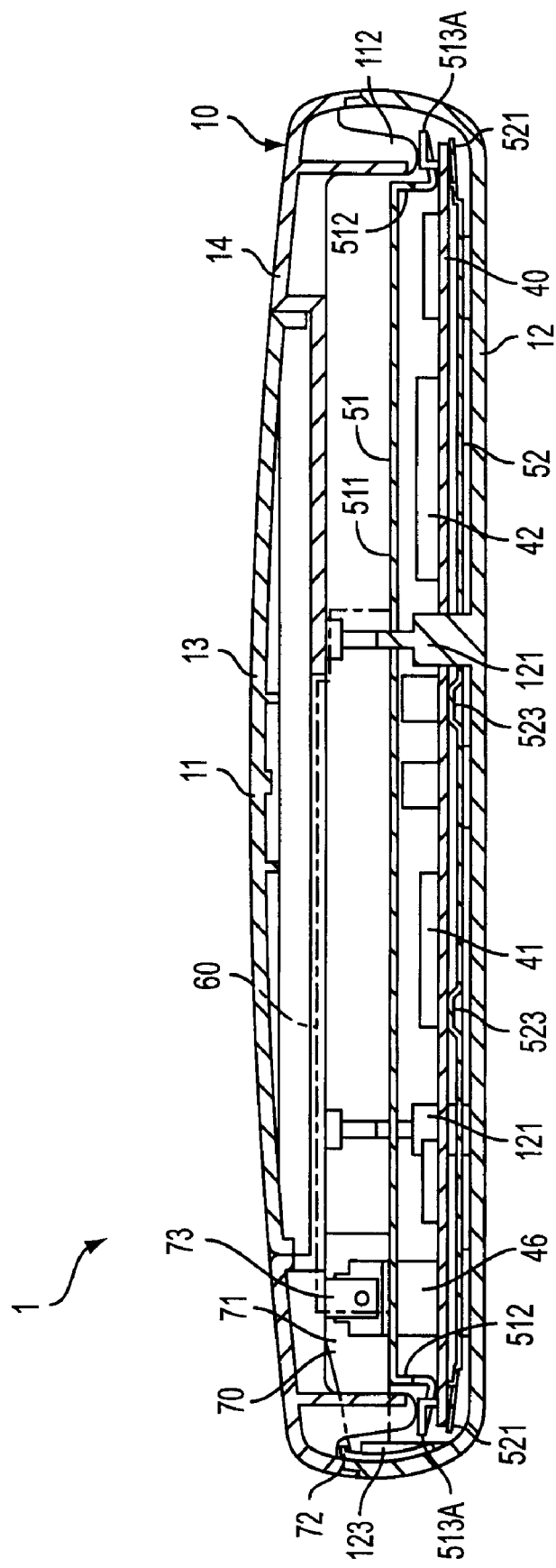
FIG. 5 is a vertical cross-sectional view of an entertainment device of the invention.

As shown in FIGS. 4 and 5, the device main body accommodated in cabinet 10, has circuit board 40, which controls entertainment device 1, metal shielding plates 51 and 52, which are laminated with this circuit board 40 and cover the front and back surfaces of said circuit board 40, disk device 60, which includes optical pickup unit 61, which is mounted in contact with the upper surface of shielding plate 51, and aluminum heat sink 70, which acts as a heat dissipator of three-terminal regulator 46, which is described below.

Mounted on circuit board 40, besides various circuit elements including CPU 41 and image processing unit 42, are connection units 43, which are constituted integrally with memory card connection parts 43A and controller connection parts 43B, power source connector 44, and audiovisual output terminal 45. Also, formed on circuit board 40 is a power supply wiring pattern for supplying electric power to CPU 41 via power source connector 44, and mounted on this power supply wiring pattern is a three-terminal regulator 46 for stabilizing the supplied voltage. In addition, a grounding pattern, not pictured, is formed on the rear side of the rim part of such circuit board 40 for obtaining the ground electric potential. In addition, insertion holes to be pierced by anchoring screws are multiply formed in positions where the grounding pattern is formed on the front and rear end edges of circuit board 40 (not pictured).

As shown in FIGS. 4 and 5, shielding plate 51, which covers the circuit element mounting surface of circuit board 40, has a flat plate-shaped part 511, with which disk device 60 comes into contact, and a rib-shaped part 512, which is provided on the rim of flat plate-shaped part 511, and flat plate-shaped part 511 and rib-shaped part 512, by covering three sides and the top of CPU 41 and image processing unit 42, prevent electromagnetic waves from leaking outside the device from these circuit elements 41 and 42. Flat plate-shaped part 511 and rib-shaped part 512 are formed in such a way as to expose connecting unit 43 to the outside in the state in which circuit board 40 and shielding plate 51 are combined, and are constituted so that the electromagnetic waves generated from CPU 41, etc. do not interfere with memory card connection parts 43A or controller connection parts 43B as noise.

Figure 6A:
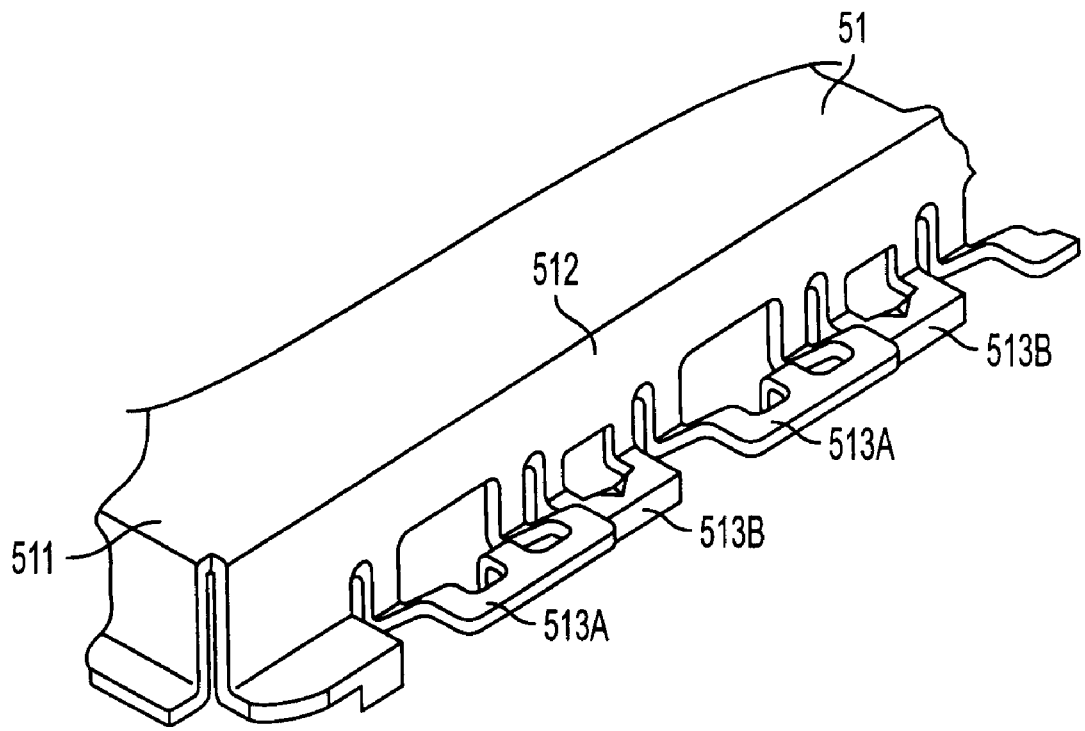
FIG. 6A is a partial perspective view showing the end of one of the shielding plates used in the electronic device of the invention.

As shown in FIG. 6A, cut-upward pieces 513A and 513B, in which part of rib-shaped part 512 is cut upward, are formed on the side part of shielding plate 51 in positions corresponding to the grounding pattern on the rim of circuit board 40. These pieces 513A and 513B each have a slightly different upward angle in the vertical direction: pieces 513A are set to an angle so that they are on the upper side with respect to the horizontal direction perpendicular to rib-shaped part 512, and pieces 513B are set to an angle so that they are on the lower side with respect to the horizontal direction. In addition, a plurality of anchoring screw insertion holes 514 each are formed on the front and rear end edges of shielding plate 51. Also, opening 515, which has a size sufficient that three-terminal regulator 46 protrudes upward through it in a state of non-contact with flat plate-shaped part 511, is formed on part of flat plate-shaped part 511 corresponding to the mounting position of said three-terminal regulator 46 mounted on circuit board 40. This exposes the upper part of three-terminal regulator 46 on flat plate-shaped part 511.

Figure 6B:
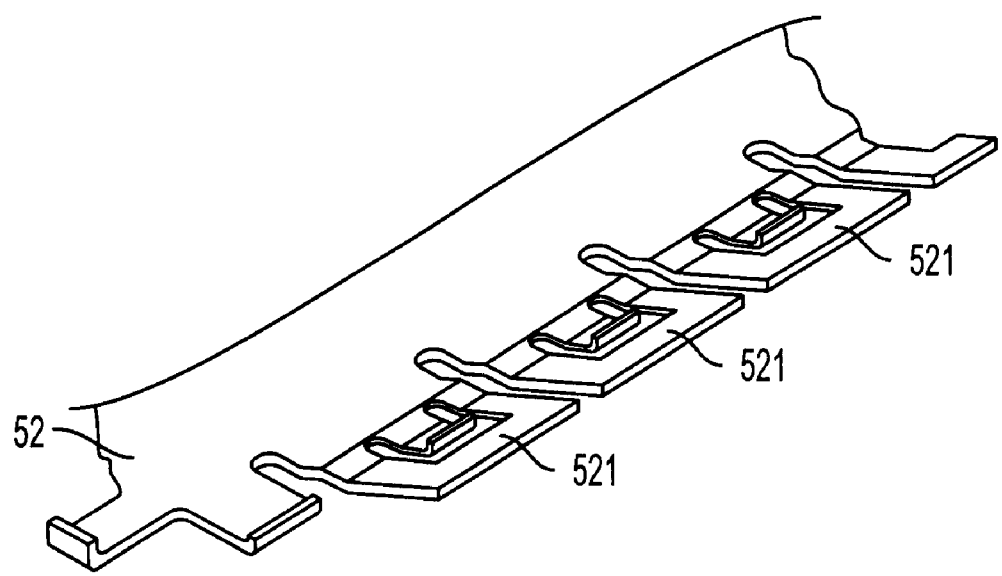
FIG. 6B is a partial perspective view showing the end of another one of the shielding plates used in the electronic device of the invention.

Shielding plate 52 consists of a metal flat plate material, and as with shielding plate 51, as shown in FIG. 6B, multiple cut-upward pieces 521, which are bent somewhat upward from the surface of shielding plate 52, are formed on its side rim corresponding to the position of the grounding pattern on the rear surface of circuit board 40, and a plurality of anchoring screw insertion holes, not pictured, are formed on its front and rear end edges. Moreover, multiple bumps 523 (FIG. 5) formed by press processing, etc. are formed in the middle part of shielding plate 52 so as to come into contact with the grounding pattern formed in the middle part on the rear surface side of circuit board 40 when in the combined state.

Disk device 60 comprises an optical pickup unit 61, a chucking member 62, and a case 63, and housed inside case 63 are a motor that causes chucking member 62 to turn and a motor that causes optical pickup unit 61 to slide. Disk device 60 is electrically connected with circuit board 40 via a cable (not shown), and the recorded content of optical disk 4 that is detected by optical pickup unit 61 is sent as an electrical signal to CPU 41, etc. of circuit board 40.

Formed on the base of lower case 12, in which such circuit board 40, shielding plates 51 and 52, and disk device 60 are accommodated, are three protrusions 121, which stand approximately in the middle of the base, and insertion holes into which to insert anchoring screws (not shown), which serve as anchoring members, while multiple protrusions 123 are formed on the inside rim surface of lower case 12 (see FIGS. 4 and 5). The three protrusions 121 that stand approximately in the middle, which are provided in order to support the weight of disk device 60, pierce shielding plates 51 and 52 and circuit board 40 and support the lower surface of disk device 60. Therefore disk device 60 comes into direct contact with shielding plate 51, but its own weight is supported strictly by these protrusions 121. For this purpose, three engagement holes 631 for engaging with protrusions 121 are formed on the rim of case 63. Also, although not pictured in the FIGS. 4 and 5, cushioning material is interposed between protrusions 121 and engagement holes 631, and any vibration acting on entertainment device 1 is absorbed by this cushioning material.

On the inside rim surface of upper case 11, protrusions (not shown) corresponding to the position of the insertion holes (not shown) of lower case 12 and panel-shaped ribs 112 (FIG. 5) are formed protruding in position corresponding to the grounding pattern of circuit board 40, and these protrusions and panel-shaped ribs 112 serve as holding-down members. Panel-shaped ribs 112 are holding-down members whose tips come into contact with cut-upward pieces 513A of shielding plate 51 and push circuit board 40 and shielding plates 51 and 52 against lower case 12, and such ribs 112 are formed so as to correspond to the position of the grounding pattern on the circuit board 40. With these panel-shaped ribs 112, reinforcing ribs (not pictured) are formed in a grid shape on the inside rim surface of upper case 11 near the base of panel-shaped ribs 112 so that a force will act on these panel-shaped ribs 112 if upper case 11 and lower case 12 are combined in a state so as to house circuit board 40, shielding plates 51 and 52, and disk device 60. Metal shielding plates (not pictured) are provided on the inside rim surface of upper case 11 and correspond to openings 18 that correspond to memory card connection parts 43A and cover the upper surface, side surfaces, and back surface of connection units 43, so that input signals from controller 2 and output signals to a memory card (not shown) are affected by noise as little as possible. Also, these shielding plates are screwed securely to the inside rim surface of upper case 11 and also function as a shutter holding means that hold shutters 18A.

Figure 7:
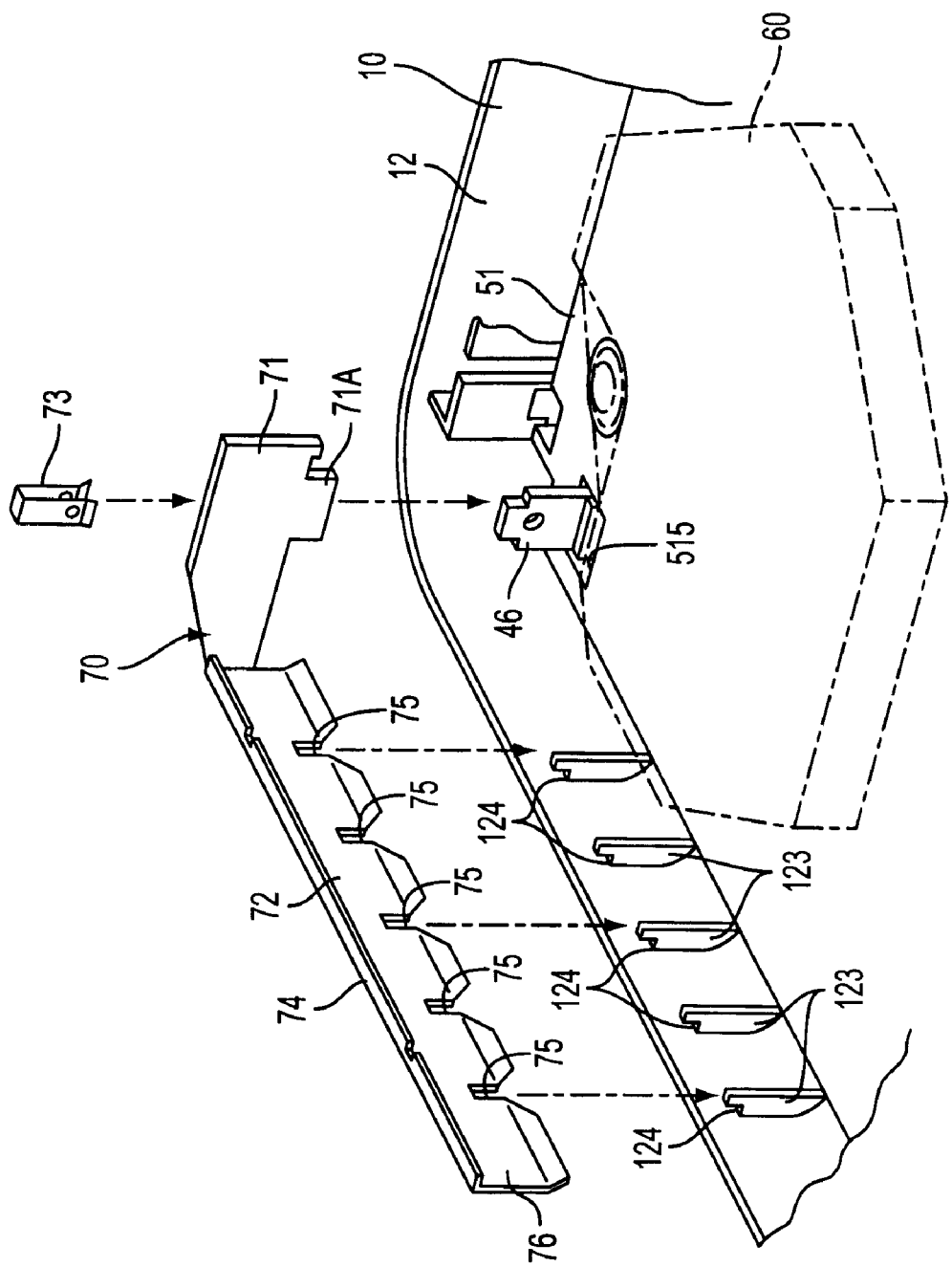
FIG. 7 is an exploded perspective view showing the attachment structure of the heat sink of the electronic device of the invention.

As shown in FIG. 7, heat sink 70 is formed in a flat L shape and has connecting part 71, which is connected to three-terminal regulator 46 and extends toward the inside rim surface of lower case 12, and main body heat dissipation part 72, which extends from one end of connecting part 71 toward the inside rim surface of lower case 12 and radiates the heat of three-terminal regulator 46. Connecting part 71 has, on its lower end, insertion piece 71A, which is inserted into opening 515, and is preferably formed in a roughly trapezoidal shape in front, and one part of connecting part 71 comes into contact with the side surface of three-terminal regulator 46 that protrudes from opening 515 and is connected with clip 73. That is, the surfaces of three-terminal regulator 46 and connecting part 71, pinched together by clip 73, are in contact with each other, so the heat from said three-terminal regulator 46 is quickly radiated from main body heat dissipation part 72 via connecting part 71. Main body heat dissipation part 72, whose cross-section is roughly L-shaped, has rectangular panel 76, which extends toward the inside rim surface of lower case 12, and reinforcing rib 74, which extends on the upper end of this panel 76 toward circuit board 40. Formed on the lower end of panel 76 are grooves 75 that are cut out from said lower end upward and are formed at prescribed intervals corresponding to the positions of protrusions 123 formed on the inside rim surface of said lower case 12 so as to engage with engagement parts 124 formed on the upper end of protrusions 123.

Thus, as shown in FIG. 7, heat sink 70 can be engaged with and mounted on the inside rim surface of lower case 12 by fitting grooves 75 of panel 76 into engagement parts 124 and affixing connecting part 71 onto three-terminal regulator 46 with clip 73. In this way, heat sink 70 provided on three-terminal regulator 46 is positioned on the outer side of circuit board 40 as seen approximately from the direction normal to the board plane of said circuit board 40. In other words, heat sink 70 is positioned between circuit board 40 and the inner rim surface of lower case 12 (the flank of circuit board 40).

In the above described embodiment, because heat sink 70 provided on three-terminal regulator 46 is positioned on the outer side of circuit board 40 as seen from the direction normal to the board plane of said circuit board 40, the heat of three-terminal regulator 46 is radiated from heat sink 70 positioned on the outer side of circuit board 40, which can prevent heating of shielding plate 51. Thus an optical pickup unit 61 or other element that is not very resistant to heat can be placed directly on top of shielding plate 51, the heat of three-terminal regulator 46 can be efficiently shed, and smaller size of entertainment device 1 can be furthered. In addition, opening 515, through which three-terminal regulator 46 protrudes without coming into contact with shielding plate 51, is formed in said shielding plate 51, and is connected with connecting part 71 of heat sink 70 at the protruding part of three-terminal regulator 46, so the heat of three-terminal regulator 46 can be surely prevented from being transmitted to shielding plate 51 without three-terminal regulator 46 and shielding plate 51 making contact with one another. In addition, engagement parts 124 for engaging with and mounting main body heat dissipation part 72 are formed in protrusions 123, which are provided on the inside rim surface of lower case 12, so heat sink 70 can be surely prevented from moving and coming into contact with shielding plate 51, and the transmission of heat to shielding plate 51 can be even more surely prevented. In addition, because the connection between three-terminal regulator 46 and heat sink 70 is made with clip 73, the connection between the two can be simplified, thereby making it possible to simplify the assembly operation for entertainment device 1.

Figure 8:
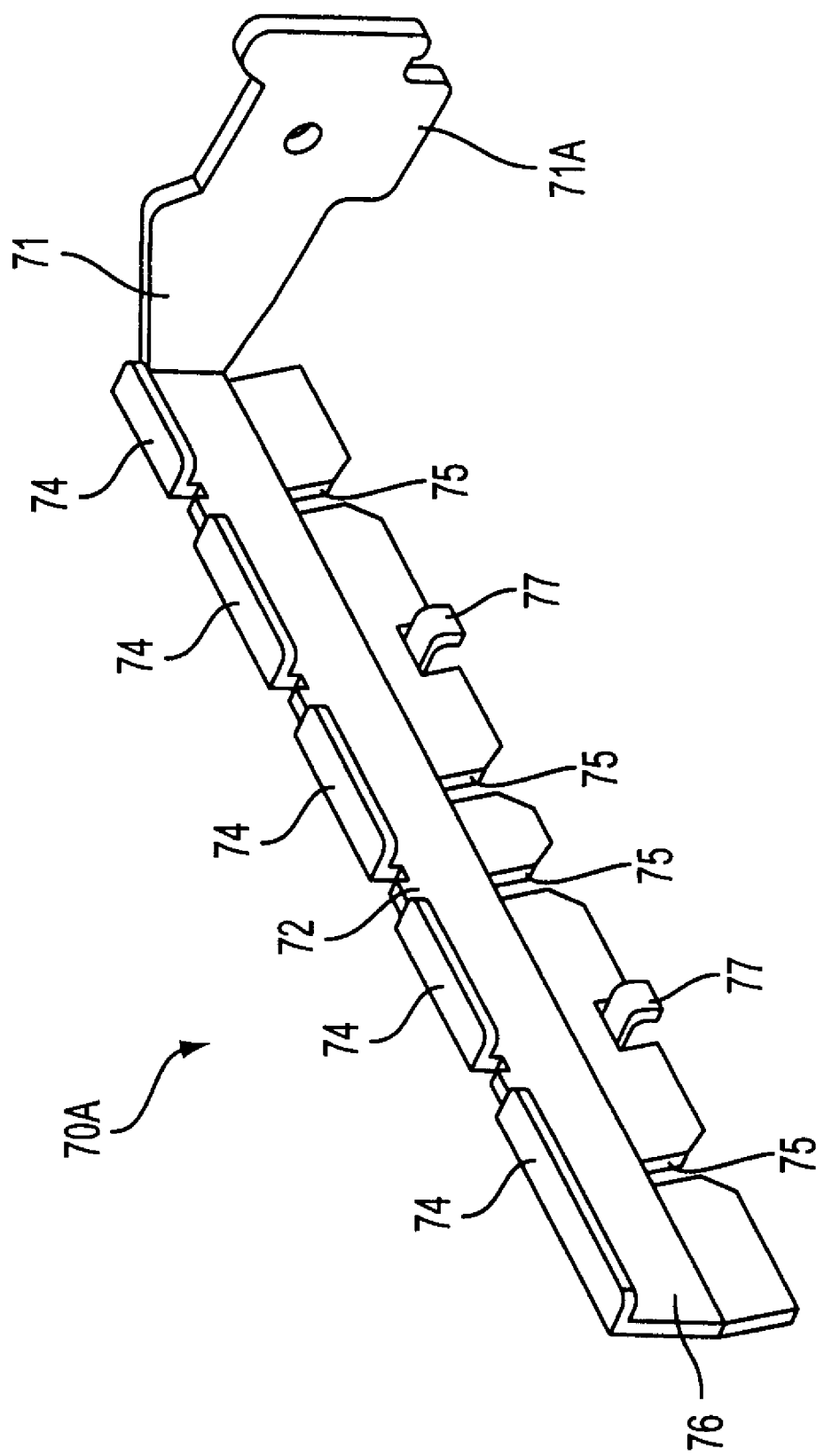
FIG. 8 is a perspective view showing an alternative embodiment of a heat sink.
Figure 9:
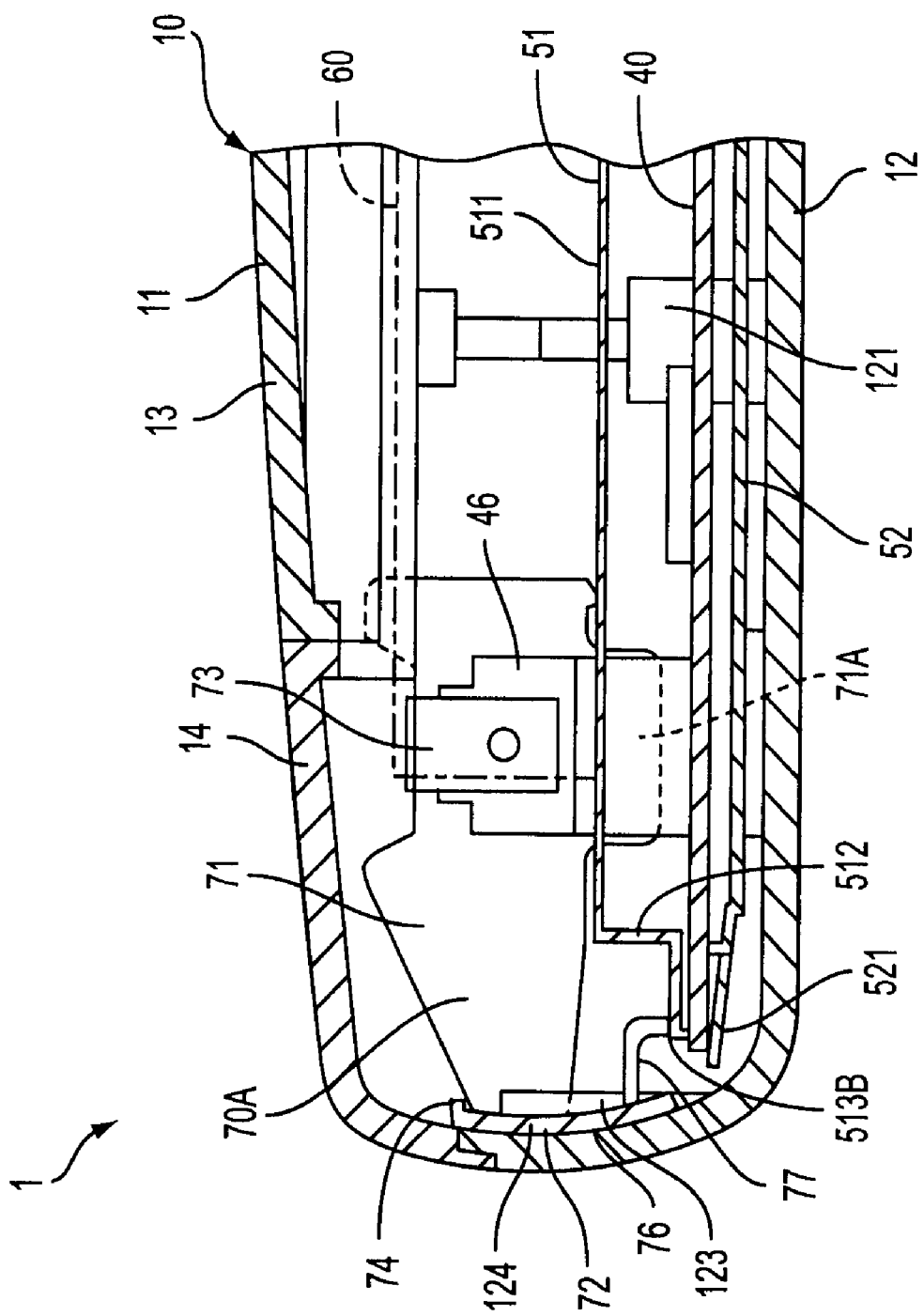
FIG. 9 is a vertical cross-sectional view of part of an entertainment device of the invention.

FIG. 8 shows an alternative embodiment of a heat sink 70A of the present invention, in which main body heat dissipation part 72 of heat sink 70 of said first embodiment is allowed to make contact with shielding plate 51. Specifically, as shown in FIG. 9, L-shaped protrusion 77, whose tip comes into contact with cut-upward pieces 513B of shielding plate 51 and which holds circuit board 40 and shielding plates 51 and 52 against lower case 12 from the surface outside direction of these boards, is cut upward and formed on the lower end of panel 76 of main body heat dissipation part 72. Protrusion 77 is provided in a position away from the connection position of heat sink 70A with three-terminal regulator 46. By allowing this protrusion 77 to make contact with cut-upward pieces 513B, in addition to the pressing force by panel-shaped ribs 112 (omitted from FIG. 9), the pressing force is strengthened, thus making the grounding connection, etc. of circuit board 40 and shielding plates 51 and 52 even more secure. In the attachment of heat sink 70A, as with heat sink 70 of said first embodiment, it can be engaged with and mounted on the inside rim surface of lower case 12 by fitting grooves 75 of panel 76 into engagement parts 124 (see also FIG. 7) and affixing connecting part 71 onto three-terminal regulator 46 with clip 73. In doing so, protrusion 77 automatically comes into contact with cut-upward pieces 513B and holds circuit board 40 and shielding plates 51 and 52 against lower case 12 from the direction outside the surface of these boards.

With an embodiment such as this, the same effects as with the aforesaid embodiment can be obtained, and because heat sink 70A is made of a metal plate of aluminum, etc., a protrusion 77 that comes into contact with shielding plate 51 is formed, thereby functioning as grounding for said shielding plate 51 and providing the effect that it is desirable as an anti-EMI measure.

Moreover, the present invention is not limited to the above embodiments; but also includes other alternative compositions, etc. that can achieve the purpose of this invention, including modifications such as, but not limited to the following.

While in the above embodiment, engagement parts for engaging the heat sink are formed on the inside rim surface of lower case 12, such engagement parts do not have to be present as long as the heat sink adheres to the inside rim surface of lower case 12, such as by an adhesive, or the like. In addition, while an opening is provided that allows the heat sink to avoid coming into contact with the shielding plate, such opening is not necessary as long as a member having a low thermal conductivity is provided on the rim of the opening, for example.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention.

I claim:

1. An electronic device comprising:

a) a circuit board on which is mounted a computation processing device and on which is formed a power supply wiring pattern for supplying electric power to said computation processing device, b) at least one metal shielding plate covering said circuit board, c) a regulator for stabilizing the supplied voltage mounted on said power supply wiring pattern, d) a heat radiator provided on said regulator and positioned on the outer side of said circuit board as seen approximately from the direction normal to the board plane of said circuit board, and e) an opening formed in said at least one metal shielding plate through which a portion of said regulator protrudes without coming into contact with said at least one shielding plate, and said heat radiator is connected to said portion of said regulator protruding through said opening.

2. An electronic device in accordance with claim 1, wherein said electronic device is contained within a cabinet, said cabinet further comprising an inner rim surface and a plurality of engagement parts arranged on said inner rim surface on which is mounted said heat radiator.

3. An electronic device in accordance with claim 2, wherein said cabinet further comprises protrusions that contact said at least one metal shielding plate and are formed in positions away from the connection between said heat radiator and said regulator.

4. An electronic device in accordance with claim 2, wherein said heat radiator further comprises a plurality of slots for sliding engagement of said heat radiator with said engagement parts on said cabinet.

5. An electronic device in accordance with claim 4, wherein said heat radiator further comprises a first portion removably attached to said engagement parts and a second portion removably attached to said regulator, said first and second portions being disposed at an angle with respect to each other.

6. An electronic device in accordance with claim 5, wherein said first and second portions of said heat radiator are disposed perpendicularly with respect to each other.

7. An electronic device in accordance with claim 6, wherein said heat radiator is clipped to said regulator.

8. An electronic device in accordance with claim 2, wherein said heat radiator further comprises protrusions that secure the connection between the at least one metal shielding plate and the circuit board.

9. An electronic device in accordance with claim 8, wherein said heat radiator protrusions are L-shaped.

* * * * *